US012635084B2

(12) United States Patent
Zhang et al.

(10) Patent No.: US 12,635,084 B2
(45) Date of Patent: May 19, 2026

(54) VEHICLE-MOUNTED LARGE-SCREEN DEVICE WITH VIBRATION

(71) Applicant: AAC Acoustic Technologies (Shanghai) Co., Ltd., Shanghai (CN)

(72) Inventors: Lijin Zhang, Shanghai (CN); Xiuyue Wang, Shanghai (CN)

(73) Assignee: AAC Acoustic Technologies (Shanghai) Co., Ltd., Shanghai (CN)

( * ) Notice: Subject to any disclaimer, the term of this patent is extended or adjusted under 35 U.S.C. 154(b) by 184 days.

(21) Appl. No.: 18/399,617

(22) Filed: Dec. 28, 2023

(65) Prior Publication Data

US 2024/0397644 A1 Nov. 28, 2024

Related U.S. Application Data

(63) Continuation of application No. PCT/CN2023/096593, filed on May 26, 2023.

(51) Int. Cl.
H05K 5/02 (2006.01)

(52) U.S. Cl.
CPC .................................. H05K 5/0204 (2013.01)

(58) Field of Classification Search
CPC ............................ H05K 5/0017; H05K 5/0217
USPC .......................................................... 361/807
See application file for complete search history.

(56) References Cited

U.S. PATENT DOCUMENTS

| 2015/0257299 A1* | 9/2015 | Su | ......................... G06F 1/1626 |
| | | | 361/679.01 |
| 2021/0222457 A1* | 7/2021 | Otsuka | ................... B60K 35/10 |

FOREIGN PATENT DOCUMENTS

| CN | 213399542 U | * | 6/2021 | ............. G06F 3/041 |
| CN | 216849170 U | * | 6/2022 | ............... H05K 5/02 |

* cited by examiner

*Primary Examiner* — Hung S. Bui
(74) *Attorney, Agent, or Firm* — Wiersch Law Group

(57) ABSTRACT

A vehicle-mounted large-screen device with vibration includes: a backlight module; a back cover, the back cover being fixed to the backlight module and forming a detachable connection therewith; a vibration unit, the vibration unit being fixed to a side of the back cover close to the backlight module and configured to generate vibration; a bracket, the bracket being arranged on a side of the back cover away from the backlight module and configured for a fixed connection with a vehicle body; and a flexible connection component, the bracket forming a flexible fixed connection with the back cover through the flexible connection component. In the present disclosure, according to the vehicle-mounted large-screen device with vibration, through elasticity of the flexible connection component, adaptive vibration can be realized according to required vibration under a driving action of the vibration unit, so as to enhance experience of the vehicle-mounted large-screen device with vibration.

9 Claims, 3 Drawing Sheets

100

A–A

VEHICLE-MOUNTED LARGE-SCREEN DEVICE WITH VIBRATION

CROSS-REFERENCE TO RELATED APPLICATIONS

This application is a continuation of International Application No. PCT/CN2023/096593, filed on May 26, 2023, which is hereby incorporated by reference in its entirety.

TECHNICAL FIELD

The present disclosure relates to the technical field of vehicle-mounted screens, and in particular, to a vehicle-mounted large-screen device with vibration.

BACKGROUND

With the continuous development of economy, various types of vehicles have penetrated into every aspect of daily life. Correspondingly, there are increasing personalized demands for high-quality driving experience.

A vehicle-mounted large-screen device is one aspect to enhance the driving experience. The vehicle-mounted large-screen device in the related art mainly includes a backlight module, a back cover covering the backlight module, and a bracket arranged on a side of the back cover away from the backlight module and configured to a fixed connection with a vehicle body, with a main function of displaying.

In order to enhance experience of the vehicle-mounted large-screen device, there is a need to add a vibration function to the vehicle-mounted large-screen device. However, both the bracket and the back cover of the vehicle-mounted large-screen device in the related art are rigidly connected, so the vibration function cannot be implemented, which greatly reduces the experience of the vehicle-mounted large-screen device.

Therefore, it is necessary to provide a vehicle-mounted large-screen device with vibration to solve the above technical problem.

SUMMARY

The technical problem to be solved in the present disclosure is how to provide a vehicle-mounted large-screen device with vibration to solve the problem in the related art that the vehicle-mounted large-screen device cannot implement the vibration function, thereby greatly reducing the experience thereof.

In order to solve the above technical problem, the present disclosure provides a vehicle-mounted large-screen device with vibration, including:

a backlight module;

a back cover, the back cover being fixed to the backlight module and forming a detachable connection therewith;

a vibration unit, the vibration unit being fixed to a side of the back cover close to the backlight module and configured to generate vibration;

a bracket, the bracket being arranged on a side of the back cover away from the backlight module and configured for a fixed connection with a vehicle body; and a flexible connection component, the bracket forming a flexible fixed connection with the back cover through the flexible connection component.

In an embodiment, the bracket includes a bracket body abutting against the side of the back cover away from the backlight module, a mounting tab extending from the bracket body, and a mounting hole passing through the mounting tab; and the flexible connection component includes a silicone pad and a bolt; the silicone pad including a first silicone ring sandwiched between the mounting tab and the back cover, a second silicone ring abutting against a side of the mounting tab away from the back cover, and a silicone sleeve connecting the first silicone ring and the second silicone ring, the silicone sleeve being inserted into the mounting hole; and the bolt passing through the second silicone ring, the silicone sleeve, and the first silicone ring in sequence and forming a threaded connection with the back cover to form a flexible fixed connection between the bracket and the back cover.

In an embodiment, a plurality of mounting holes, a plurality of silicone pads, and a plurality of bolts are provided respectively and are in one-to-one correspondence to each other.

In an embodiment, the silicone sleeve forms an interference fit with the mounting hole.

In an embodiment, the second silicone ring, the silicone sleeve, and the first silicone ring form an integrally formed structure.

In an embodiment, the bracket has a circular structure, and the plurality of silicone pads are evenly arranged along a circumferential direction of the bracket.

In an embodiment, the silicone pad is made of silicone with Shore hardness of 30 degree.

In an embodiment, a plurality of vibration units are provided on and fixed to the back cover at equal intervals.

In an embodiment, the bracket is made of structural steel; and the back cover is made of an aluminum alloy.

In an embodiment, the vibration unit is a linear vibration motor.

Compared with the related art, according to the vehicle-mounted large-screen device with vibration in the present disclosure, the vibration unit is arranged on the side of the back cover close to the backlight module, the bracket for a fixed connection with the vehicle body is arranged on the side of the back cover away from the backlight module, and the flexible connection component is arranged between the bracket and the back cover, so that, by means of the elasticity of the flexible connection component, when a certain displacement constraint is met, some translational degrees of freedom at a joint surface can be released, enabling the vehicle-mounted large-screen device with vibration to achieve adaptive vibration according to required vibration under the driving action of the vibration unit, so as to enhance the experience of the vehicle-mounted large-screen device with vibration.

BRIEF DESCRIPTION OF DRAWINGS

In order to illustrate the technical solutions in the embodiments of the present disclosure more clearly, the accompanying drawings to be used in the description of the embodiments will be briefly introduced below. Obviously, the accompanying drawings in the following description are only some embodiments of the present disclosure. For those of ordinary skill in the art, other accompanying drawings can be obtained based on these drawings. In the drawings.

Figure 1:
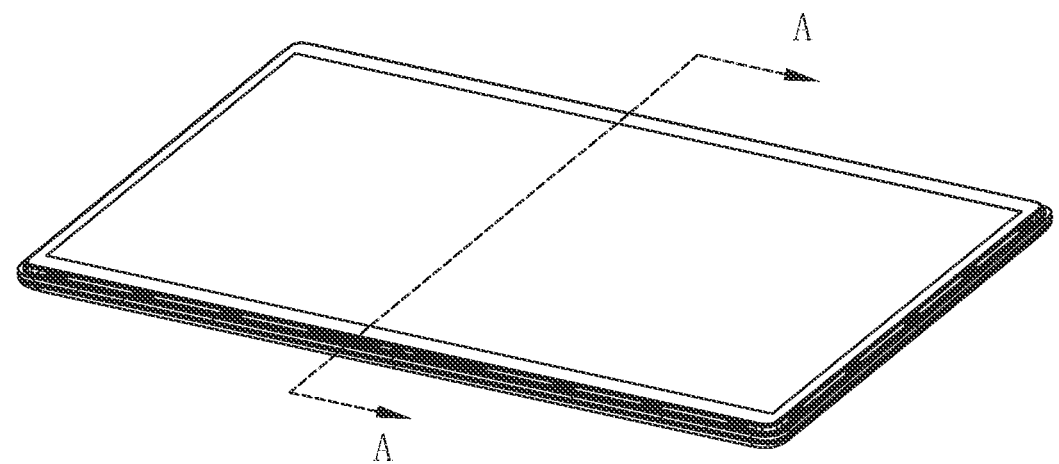
FIG. 1 is a schematic diagram of a three-dimensional structure of a vehicle-mounted large-screen device with vibration according to an embodiment of the present disclosure.

In the drawings, 100: vehicle-mounted large-screen device with vibration; 1: backlight module; 2: back cover; 3: vibration unit; 4: bracket; 41: bracket body; 42: mounting tab; 43: mounting hole; 5: flexible connection component; 51: silicone pad; 511: first silicone ring; 512: second silicone ring; 513: silicone sleeve; 52: bolt; 6: printed circuit board (PCB).

DESCRIPTION OF EMBODIMENTS

The technical solutions in the embodiments of the present disclosure will be clearly and completely described below with reference to the accompanying drawings in the embodiments of the present disclosure. Obviously, the described embodiments are only some of the embodiments of the present disclosure, but not all of the embodiments. Based on the embodiments of the present disclosure, all other embodiments obtained by those of ordinary skill in the art without creative efforts fall within the protection scope of the present disclosure.

Figure 2:
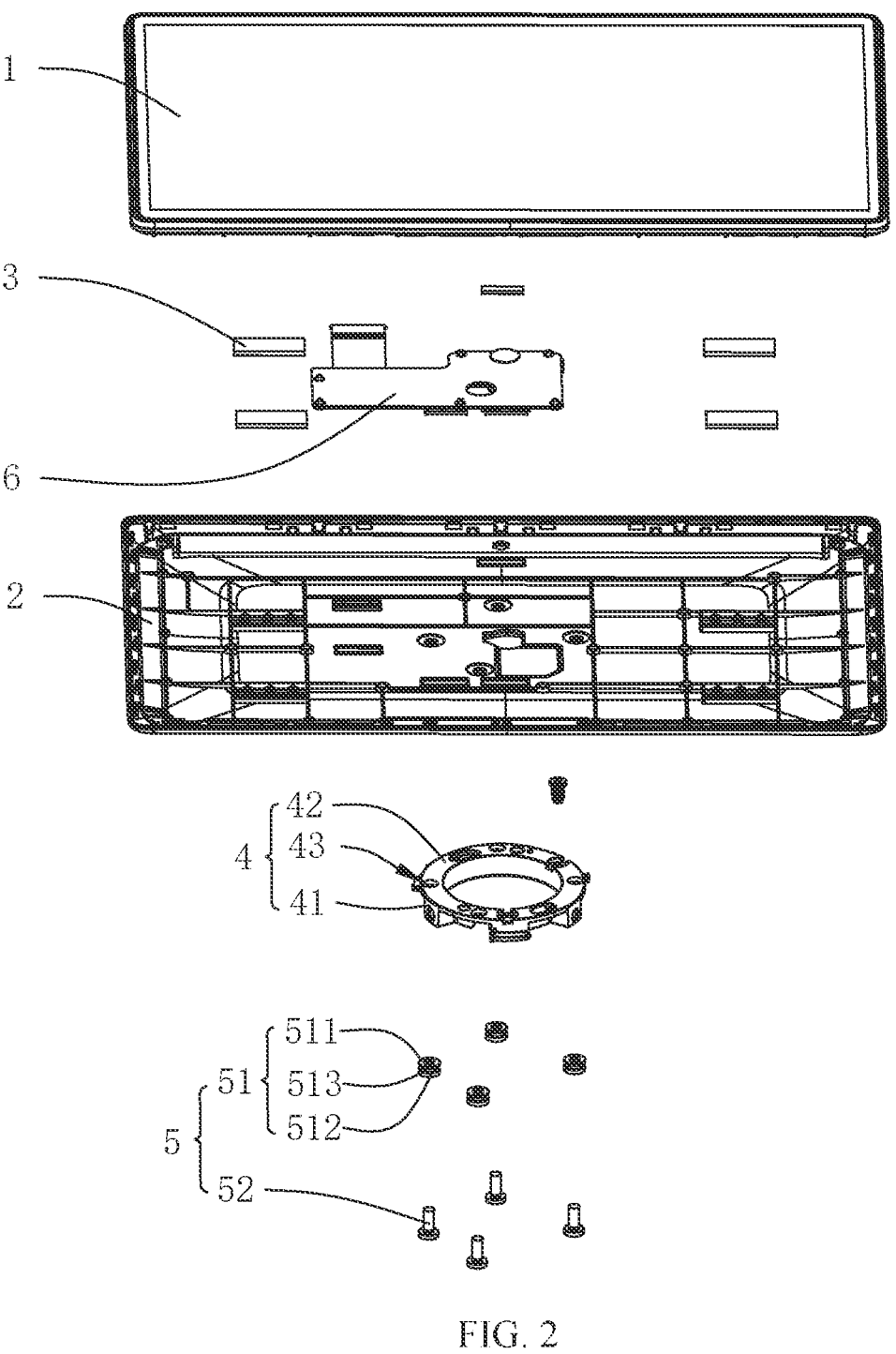
FIG. 2 is a schematic exploded view of a structure of the vehicle-mounted large-screen device with vibration according to an embodiment of the present disclosure.
Figure 3:
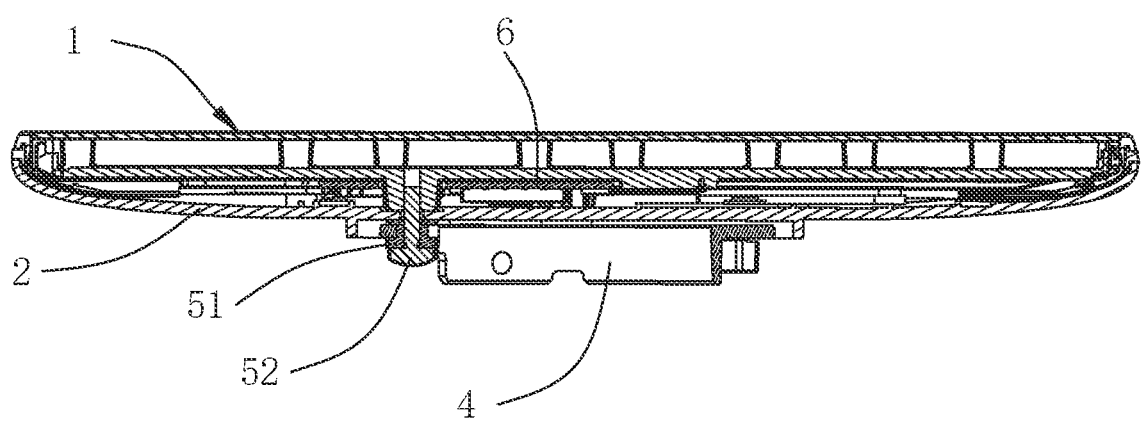
FIG. 3 is a sectional view taken along a line A-A in FIG. 1.

The present disclosure provides a vehicle-mounted large-screen device with vibration 100, which, referring to FIG. 1 to FIG. 3, includes a backlight module 1, a back cover 2, a vibration unit 3, a bracket 4, and a flexible connection component 5.

The back cover 2 covers and is fixed to the backlight module 1 and forms a detachable connection therewith. The vibration unit 3 is fixed to a side of the back cover 2 close to the backlight module 1 and configured to generate vibration. The bracket 4 is arranged on a side of the back cover 2 away from the backlight module 1 and configured for a fixed connection with a vehicle body. The bracket 4 forms a flexible fixed connection with the back cover 2 through the flexible connection component 5.

Certainly, the vehicle-mounted large-screen device with vibration 100 is further provided with a PCB 6 fixed to the side of the back cover 2 close to the backlight module 1. The PCB 6 has a built-in function for converting a mechanical signal (pressure) into an electrical signal (voltage) that has sinusoidal variation at a certain exact frequency. The PCB 6 is also electrically connected to the backlight module 1 and the vibration unit 3 respectively, and is electrically connected to a jack provided in the back cover 2.

A vibration principle of the vehicle-mounted large-screen device with vibration 100 is as follows. The vehicle-mounted large-screen device with vibration 100, when subjected to an external touch screen force, converts the mechanical signal into the electrical signal that has sinusoidal variation at the exact frequency under feedback of the PCB 6, and the vibration unit 3 may generate a driving force at a same frequency under voltage excitation of the frequency. Since the bracket 4 and the back cover 2 are connected through the flexible connection component 5, by means of hyperelasticity of the flexible connection component 5, when a certain displacement constraint is met, some translational degrees of freedom at a joint surface can be released, that is, the back cover 2 and the backlight module 1 are allowed to translate along two directions of their planes within a certain displacement range, and the bracket 4 and the back cover 2 may achieve adaptive vibration according to required vibration under a sinusoidal alternating driving force, so as to enhance the experience of the vehicle-mounted large-screen device with vibration 100. When the vibration unit 3 drives the entire vehicle-mounted large screen module 100 to perform directional vibration, degrees of freedom in certain directions are released within a certain displacement range by using hyperelasticity of the flexible connection component 5. When the entire vehicle-mounted large-screen device 100 is in a non-operating state, the flexible connection component 5 can constrain all degrees of freedom thereof, making the vehicle-mounted large-screen device in a resting state.

In an embodiment, the back cover 2 is made of an aluminum alloy, and the bracket 4 is made of structural steel. Certainly, according to an actual requirement, other materials may alternatively be selected for the back cover 2 and the bracket 4.

In an embodiment, multiple vibration units 3 are provided on and fixed to the back cover 2 at equal intervals. In this way, the vibration effect of the entire vehicle-mounted large-screen device 100 can be improved.

In an embodiment, four vibration units 3 are fixed to the back cover 2 at intervals.

In an embodiment, the vibration unit 3 is a linear vibration motor. Certainly, according to an actual requirement, other devices that can generate vibration may alternatively be selected as the vibration unit 3.

In an embodiment, the bracket 4 includes a bracket body 41 abutting against the side of the back cover 2 away from the backlight module 1, a mounting tab 42 extending from the bracket body 41, and a mounting hole 43 passing through the mounting tab 42.

In an embodiment, the bracket 4 has a circular structure. Certainly, according to an actual requirement, the bracket 4 may alternatively be designed into other shapes and structures, such as a rectangle or a triangle.

In an embodiment, the flexible connection component 5 includes a silicone pad 51 and a bolt 52. The silicone pad 51 includes a first silicone ring 511 sandwiched between the mounting tab 42 and the back cover 2, a second silicone ring 512 abutting against a side of the mounting tab 42 away from the back cover 2, and a silicone sleeve 513 connecting the first silicone ring 511 and the second silicone ring 512. The silicone sleeve 513 is inserted into the mounting hole 43. The bolt 52 passes through the second silicone ring 512, the silicone sleeve 513, and the first silicone ring 511 in sequence and forms a threaded connection with the back cover 2 to form a flexible fixed connection between the bracket 4 and the back cover 2. The silicone pad 51 has one end face abutting against a head of the bolt 52 and the other end face abutting against the back cover 2, to support the entire vehicle-mounted large-screen device 100.

In an embodiment, the silicone pad 51 is made of silicone with Shore hardness of 30 degree. Certainly, according to an actual requirement, the silicone pad 51 may alternatively be made of other types of silicone.

In an embodiment, multiple mounting holes 43, multiple silicone pads 51, and multiple bolts 52 are provided respectively and are in one-to-one correspondence to each other. In this way, the bracket 4 can be better supported, the vibration is more uniform.

Multiple silicone pads 51 are evenly arranged along a circumferential direction of the bracket 4. In this way, the backlight module 1 and the back cover 2 can be evenly stably supported, and at the same time, degrees of freedom of the backlight module 1 and the back cover 2 can be evenly constrained and released.

In an embodiment, four mounting holes 4, four silicone pads 51, and four bolts 52 are provided respectively and are in one-to-one correspondence to each other.

In an embodiment, the silicone sleeve 513 forms an interference fit with the mounting hole 43. In this way, loosening of the silicone pad 51 can be prevented.

In an embodiment, the second silicone ring 512, the silicone sleeve 513, and the first silicone ring 511 form an integrally formed structure. In this way, overall structural strength of the silicone pad 51 can be improved.

Compared with the related art, according to the vehicle-mounted large-screen device with vibration 100 in the present disclosure, the vibration unit 3 is arranged on the side of the back cover 2 close to the backlight module 1, the bracket 4 for a fixed connection with the vehicle body is arranged on the side of the back cover 2 away from the backlight module 1, and the flexible connection component is arranged between the bracket 4 and the back cover 2, so that, by means of the elasticity of the flexible connection component 5, when a certain displacement constraint is met, some translational degrees of freedom at a joint surface can be released, enabling the vehicle-mounted large-screen device with vibration 100 to achieve adaptive vibration according to required vibration under the driving action of the vibration unit 3, that is, suspension motion can be achieved, so as to enhance the experience of the vehicle-mounted large-screen device with vibration 100.

The above are merely the embodiments of the present disclosure. It should be noted herein that, for those skilled in the art, improvements can be made without departing from the creative concept of the present disclosure, but these all fall within the protection scope of the present disclosure.

What is claimed is:

1. A vehicle-mounted large-screen device with vibration, comprising:
   a backlight module;
   a back cover covering on and fixed to the backlight module, wherein the back cover is detachably connected to the backlight module;
   a vibration unit fixed to a side of the back cover close to the backlight module and configured to generate vibration;
   a bracket arranged on a side of the back cover away from the backlight module and configured for a fixed connection with a vehicle body; and
   a flexible connection component, wherein the bracket and the back cover form a flexible fixed connection through the flexible connection component;
   wherein the bracket comprises a bracket body abutting against the side of the back cover away from the backlight module, a mounting tab extending from the bracket body, and a mounting hole passing through the mounting tab;
   the flexible connection component comprises a silicone pad and a bolt; and
   the silicone pad comprises a first silicone ring sandwiched between the mounting tab and the back cover, a second silicone ring abutting against a side of the mounting tab away from the back cover, and a silicone sleeve connecting the first silicone ring and the second silicone ring,
   the silicone sleeve is inserted into the mounting hole; and
   the bolt passes through the second silicone ring, the silicone sleeve, and the first silicone ring in sequence, and forms a threaded connection with the back cover to form a flexible fixed connection between the bracket and the back cover.

2. The vehicle-mounted large-screen device with vibration as described in claim 1, wherein a plurality of mounting holes, a plurality of silicone pads, and a plurality of bolts are provided respectively and are arranged in one-to-one correspondence.

3. The vehicle-mounted large-screen device with vibration as described in claim 2, wherein the bracket has a circular structure, and the plurality of silicone pads are evenly arranged along a circumferential direction of the bracket.

4. The vehicle-mounted large-screen device with vibration as described in claim 1, wherein the silicone sleeve forms an interference fit with the mounting hole.

5. The vehicle-mounted large-screen device with vibration as described in claim 1, wherein the second silicone ring, the silicone sleeve, and the first silicone ring form an integrally formed structure.

6. The vehicle-mounted large-screen device with vibration as described in claim 1, wherein the silicone pad is made of silicone with Shore hardness of 30 degree.

7. The vehicle-mounted large-screen device with vibration as described in claim 1, wherein a plurality of vibration units are provided on and fixed to the back cover at equal intervals.

8. The vehicle-mounted large-screen device with vibration as described in claim 1, wherein the bracket is made of structural steel; and the back cover is made of an aluminum alloy.

9. The vehicle-mounted large-screen device with vibration as described in claim 1, wherein the vibration unit is a linear vibration motor.

* * * * *